United States Patent [19]
Ura et al.

[11] Patent Number: 5,238,173
[45] Date of Patent: Aug. 24, 1993

[54] WIRE BONDING MISATTACHMENT DETECTION APPARATUS AND THAT DETECTION METHOD IN A WIRE BONDER

[75] Inventors: Masanao Ura; Naokazu Watanabe, both of Tokyo, Japan

[73] Assignee: Kaijo Corporation, Tokyo, Japan

[21] Appl. No.: 983,759

[22] Filed: Dec. 1, 1992

[30] Foreign Application Priority Data

Dec. 4, 1991 [JP] Japan .................................. 3-347780
May 7, 1992 [JP] Japan .................................. 4-141079
May 7, 1992 [JP] Japan .................................. 4-141080

[51] Int. Cl.$^5$ ............................................. H01L 21/60
[52] U.S. Cl. .................................... 228/104; 228/4.5
[58] Field of Search ..................... 228/4.5, 9, 104, 103

[56] References Cited

U.S. PATENT DOCUMENTS

| | | | |
|---|---|---|---|
| 4,213,556 | 7/1980 | Persson et al. | 228/104 |
| 4,555,052 | 11/1985 | Kurtz et al. | 228/104 |
| 4,821,944 | 4/1989 | Tsumura | 228/4.5 X |
| 5,058,797 | 10/1991 | Terakado et al. | 228/104 |

*Primary Examiner*—Kenneth J. Ramsey
*Attorney, Agent, or Firm*—Sughrue, Mion, Zinn, Macpeak & Seas

[57] ABSTRACT

The present invention provides a wire bonder and its method able to reliably and efficiently perform non-contact detection of the misattachment of wires spread between the pads of various types of bonded components and a lead without damage to said bonded component. The present invention is equipped with a clamp provided above a capillary through which is passed a wire, a toroidal coil provided above the capillary without making contact with the wire, a high frequency oscillator that generates a high frequency to the toroidal coil, and a differentiation circuit that detects whether the wire connected to the bonded component is misattached, so that the present invention is able to detect whether the wire to be connected to the bonded component is misattached by this differentiation circuit. Alternatively, the toroidal coil is provided within a path that forms a loop between a clamping device, that performs cutting of the wire, and a bonding stage, without making contact with the line that composes said path.

15 Claims, 11 Drawing Sheets

WIRE BONDING MISATTACHMENT DETECTION APPARATUS AND THAT DETECTION METHOD IN A WIRE BONDER

BACKGROUND OF THE INVENTION

1. Field of the Invention

The present invention relates to a wire bonder that performs bonding by spreading a wire between the bonded component, in the form of a semiconductor component (IC chip), and a lead, and more particularly, to a bonding misattachment detection apparatus and that detection method in a wire bonder able to detect misattachment when, for example, the wire breaks or there is a defective connection (referred to as misattachment) in the case wire that is spread between, in particular, an IC chip and a lead, is not connected.

2. Description of the Prior Art

In the case of performing bonding between the pad of an IC chip and a lead using this type of wire bonder of the prior art, the wire is held with a bonding tool in the form of a capillary provided on the end of a bonding arm, which is then brought in contact with the surface of the target pad or lead, followed by crushing of a portion of the wire, on which a ball was formed on the end, using said capillary to perform thermocompression bonding. There are also cases in which ultrasonic vibrations are simultaneously applied to the end of the wire at this time.

The following provides an explanation of this wire bonding process referring to FIG. 1. When wire bonding is to be performed on the pad (electrode) on IC chip 25 placed on bonding stage 26, capillary 7, through which wire 9, having a ball formed on its end, is passed, is positioned by movement of an XY table based on the information from a photographic apparatus not shown. Following this positioning, capillary 7 is lowered as indicated in steps (1) through (3) of FIG. 1 to crush the ball onto the above-mentioned pad and perform thermocompression bonding.

In this process, the bonding arm is lowered and moved at high speed from step (1) to step (2), and moved at low speed from step (2) to step (3). Clamp 8a is open at this time. Next, when connection to the 1st bonding point is completed, bonding arm 1 is raised upward (direction of the Z axis) as indicated in FIG. 1 with clamp 8a remaining open from step (3) to step (4). Wire 9 is then pulled out with clamp 8a still open following a prescribed loop control as indicated in step (5). This is then connected to the 2nd bonding point in the form of lead 27 as indicated in step (6).

Following this connection, clamp 8a closes after wire 9 has been pulled out by a prescribed feed amount f from the end of capillary 7 as indicated in step (7). While still in this state, wire 9 is cut as indicated in step (8) in the process of bonding arm 1 further rising to a prescribed height. A ball is again formed on the end of the wire using an electric torch followed by returning to the state of step (1) with clamp 8a open. Wire bonding is thus performed by this series of steps.

In the case the wire should happen to break and so forth in this series of steps for performing the above-mentioned wire bonding, defective bonding will result. Thus, it is necessary to detect such broken wires and so forth. A known example of a method used to detect broken wires of the prior art is disclosed in Japanese Patent Laid-Open No. 50-68271.

In this method, wire bonding is performed utilizing the timing of a momentary event in which clamp 8a closes and only capillary 7 rises as indicated in step (7) of FIG. 1. After insulating clamp 8a from the wire bonder in advance, a voltage is applied between clamp 8a and lead 27 so that clamp 8a is positive and lead 27 is negative. By taking advantage of the momentary closing of clamp 8a and rising of capillary 7 in this state, the continuity is measured between clamp 8a and lead 27 by producing a timing signal for testing continuity. Evaluation of broken wires is then performed by running this timing signal and continuity signal into both inputs of an AND circuit. In other words, when both the timing signal and continuity signal are applied to the AND circuit, an output signal is produced from the AND circuit indicating that bonding work is being performed normally. When only the timing signal is applied to the AND circuit and an output signal is not produced from the AND circuit, this indicates that a broken wire has been encountered during wire bonding.

3. Problems that the Invention is to Solve

However, in the method of the prior art for detection of broken wires in wire bonders, since broken wire detection is performed by applying a voltage between clamp 8a and lead 27 so that clamp 8a is positive and lead 27 is negative, application of such a voltage can damage bonded components such as semiconductor components (IC chips) featuring reduced thickness and increased level of integration in recent years. In addition, there is also the risk of these components being damaged due to generation of static electricity.

In addition, the method of the prior art also has the disadvantage of it being necessary to determine the polarity and so forth of the pad of the semiconductor component (IC chip), thus limiting the types of IC chips to which this method can be applied. Furthermore, since the detection method of the prior art requires screening of those IC chips that can be detected, it has the additional disadvantage of preventing improvement of work efficiency.

In addition, when the detection method of the prior art was applied to semiconductor components such as metal-oxide semiconductor integrated circuits (MOS integrated circuits), it is difficult to perform detection using the conventional direct current detection method. In addition, since it is also difficult to set the detection level with this method, the detection method of the prior art has the additional disadvantage of being impractical in the case of the above-mentioned components.

SUMMARY OF THE INVENTION

In consideration of the above-mentioned problems of the prior art, the object of the present invention is to provide a wire bonding misattachment detection apparatus and its method in a wire bonder able to reliably and efficiently perform non-contact detection of the misattachment of wires spread between the pads of various types of bonded components and a lead without damage to said bonded component.

The present invention comprises: a bonding arm holding a bonding tool through which a wire is passed; a support mechanism that allows said bonding arm to be moved freely; a clamping device provided above the above-mentioned bonding tool that performs cutting of the wire by clamping the above-mentioned wire using an opening and closing mechanism; a high frequency generation device provided at a location above the above-mentioned bonding tool and not in contact with the above-mentioned wire; and, a misattachment detection device that detects whether a wire connected to a bonded component is misattached by generating a high frequency from said high frequency generation device; wherein, said misattachment detection device is able to detect whether the wire to be connected with the bonded component is misattached.

In addition, the present invention also comprises a wire bonding method by which a bonding arm holding a bonding tool, through which a wire is passed, is supported so as to be allowed to move freely by a support mechanism, and following completion of bonding of the above-mentioned bonding tool to a 1st bonding point by that movement, bonding is performed by moving said bonding tool to a 2nd bonding point; wherein, a misattachment detection device is able to detect whether a wire connected to a bonded component has been misattached by the generation of a high frequency by a high frequency generation device provided at a location above the above-mentioned bonding tool and not in contact with the above-mentioned wire.

Furthermore, the present invention also comprises: a bonding stage on which a bonded component is placed; a bonding arm holding a bonding tool through which a wire is passed; a support mechanism that allows said bonding arm to be moved freely; a clamping device that performs cutting of the wire by clamping the above-mentioned wire using an opening and closing mechanism; a high frequency generation device provided within a path that forms a loop between said clamping device and the above-mentioned bonding stage while also remaining out of contact with the line that composes said path; and, a misattachment detection device that detects whether a wire connected to a bonded component is misattached by generating a high frequency from said high frequency generation device; wherein, said misattachment detection device is able to detect whether the wire to be connected with the bonded component is misattached.

Moreover, the present invention also comprises a wire bonding method by which a bonding arm holding a bonding tool, through which a wire is passed, is supported so as to be allowed to move freely by a support mechanism, and following completion of bonding of the above-mentioned bonding tool to a 1st bonding point by that movement, bonding is performed by moving said bonding tool to a 2nd bonding point; wherein, a misattachment detection device is able to detect whether a wire connected to a bonded component has been misattached by the generation of a high frequency by a high frequency generation device provided within a path that forms a loop between the above-mentioned bonding stage and a clamping device that performs cutting of wire by clamping the above-mentioned wire using a switch mechanism, while also remaining out of contact with the line that composes said path.

DESCRIPTION OF THE PREFERRED EMBODIMENTS

The following provides an explanation of the embodiments of the present invention with reference to the drawings. Furthermore, FIG. 2 indicates the essential components of the wire bonder pertaining to the present invention along with a partial cross-section of the bonding misattachment detection apparatus, while FIG. 3 is a cross-sectional drawing taken along lines A—A with respect to FIG. 2.

Figure 2:
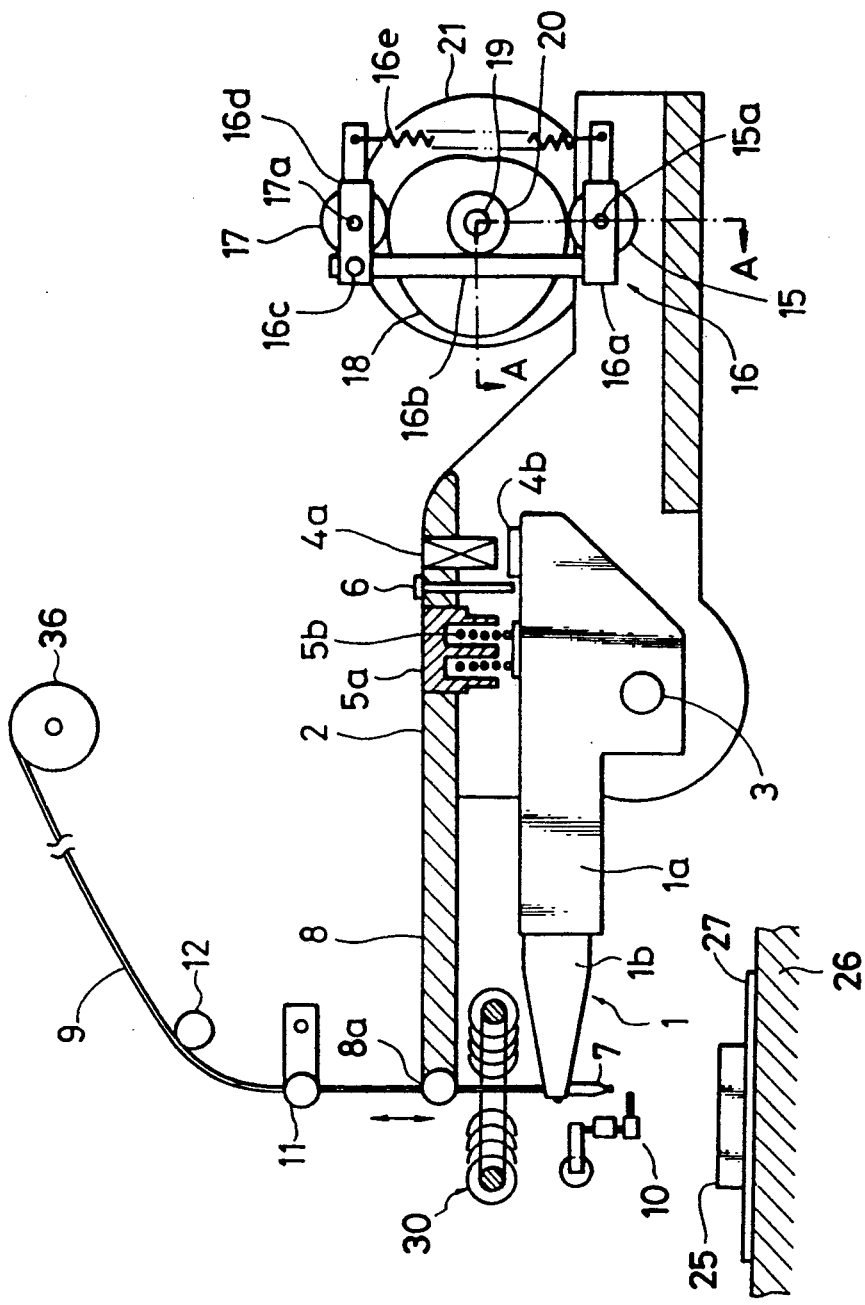
FIG. 2 is a drawing indicating the essential components of the wire bonder pertaining to the present invention along with a partial cross-section of the bonding misattachment detection apparatus.

In this wire bonder, bonding arm 1, comprised of holding frame 1a and horn 1b, is able to oscillate around the shaft center of support shaft 3 together with oscillating arm 2 as indicated in FIG. 2. This bonding arm 1 is firmly attached on support shaft 3, and oscillating arm 2 is fit onto support shaft 3 so as to oscillate freely. This support shaft 3 is equipped on an XY table, etc., not shown. Furthermore, an ultrasonic vibrator (not shown) for applying vibrations to horn 1b is incorporated within holding frame 1a. Solenoid 4a and electromagnetic adsorption piece 4b are mounted in opposition to each other on oscillating arm 2 and holding frame 1a, respectively. When bonding arm 1 is oscillated, current is supplied to solenoid 4a from a power supply not shown. As a result of adsorption force then being produced between solenoid 4a and electromagnetic adsorption piece 4b, said bonding arm 1 and oscillating arm 2 are mutually coupled in a fixed state. However, an adjustable stopper 6, held in place by screws, etc., is provided on oscillating arm 2 to prevent adsorption in excess of a prescribed distance. In addition, magnet 5a and coil 5b are respectively mounted on oscillating arm 2 and holding frame 1a at a location to the front of the above-mentioned electromagnetic adsorption device. Magnet 5a and coil 5b compose a device that produces adsorption force for maintaining the end of bonding arm 1, or in other words the site where the bonding tool in the form of capillary 7 is held, downward as indicated in FIG. 3.

In addition, clamp arm 8 is provided on the end of oscillating arm 2. A clamping device in the form of clamp 8a for holding wire 9 and cutting said wire 9 using a method to be described forthwith is provided on the end of said clamp arm 8. Said clamp 8a performs holding and cutting by an opening and closing mechanism not shown comprised of a solenoid and spring, etc. In addition, electric torch 10 is arranged below capillary 7 on a vertical shaft not shown so as to be able to rotate by the action of an actuator, etc. Said electric torch 10 is of a composition such that it is able to rotate around capillary 7 accompanying movement of bonding arm 1. This electric torch 10 forms a ball on the end of wire 9 by applying a prescribed voltage. In addition, a tension clamp 11 is arranged above clamp 8a supported on a frame not shown. Said tension clamp 11 is able to open and close by an opening and closing mechanism not shown to apply a prescribed tension to wire 9 and constantly maintain wire 9 lying straight to the end of capillary 7 of bonding arm 1. This wire 9 is also wound onto spool 36 via guide 12.

Figure 3:
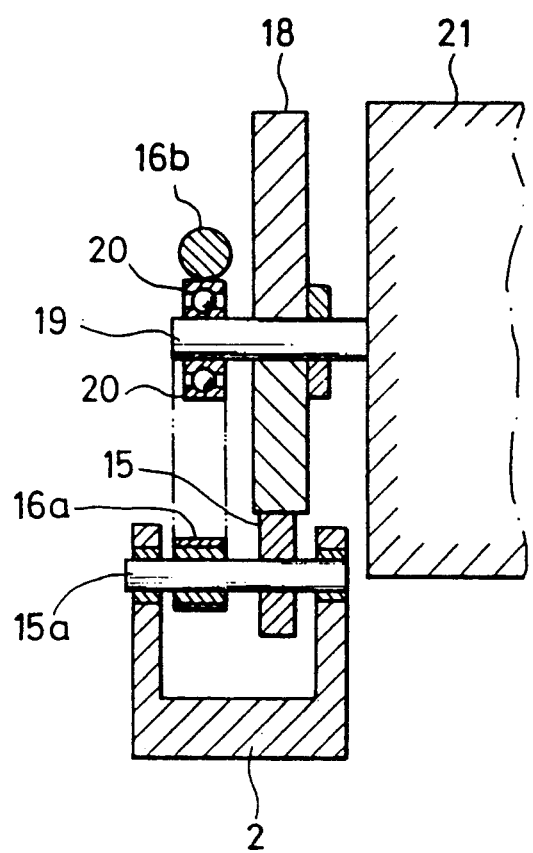
FIG. 3 is a cross-sectional drawing taken along the lines A—A with respect to FIG. 2.

As indicated in FIG. 3, support shaft 15a is provided on the rear end of oscillating arm 2. Arm-side cam follower 15 and oscillating base 16a are allowed to rotate freely around this support shaft 15a. One end of bearing guide 16b is mounted on oscillating base 16a, and pre-loading arm 16d is attached to the other end of bearing guide 16b via support pin 16c. Support shaft 17a is provided on the free end of pre-loading arm 16d, and cam follower 17 is attached to said support shaft 17a so as to be able to rotate freely. A tensile spring in the form of pre-loading spring 16e is spread between the end of the pre-loading arm 16d and the end of oscillating base 16a, and arm-side cam follower 15 and cam follower 17 pressed onto the external surface of cam 18 formed roughly into the shape of a heart. Furthermore, the two contact points of arm-side cam follower 15 and cam follower 17 on cam 18 are positioned on either side of the center of rotation of said cam 18.

A frame structure is formed by this oscillating base 16a, bearing guide 16b and pre-loading arm 16d. This frame structure is generically referred to as oscillating frame 16. Bearing guide 16b, one of the constituent members of oscillating frame 16, makes contact with the contour of radial bearing 20 attached on cam shaft 19 on which cam 18 is fit. Furthermore, cam 18 rotates by torque applied to cam shaft 19 by motor 21. In addition, the height of the bonding tool in the form of capillary 7 is detected by a rotary encoder not shown coupled to support shaft 3.

Figure 4:
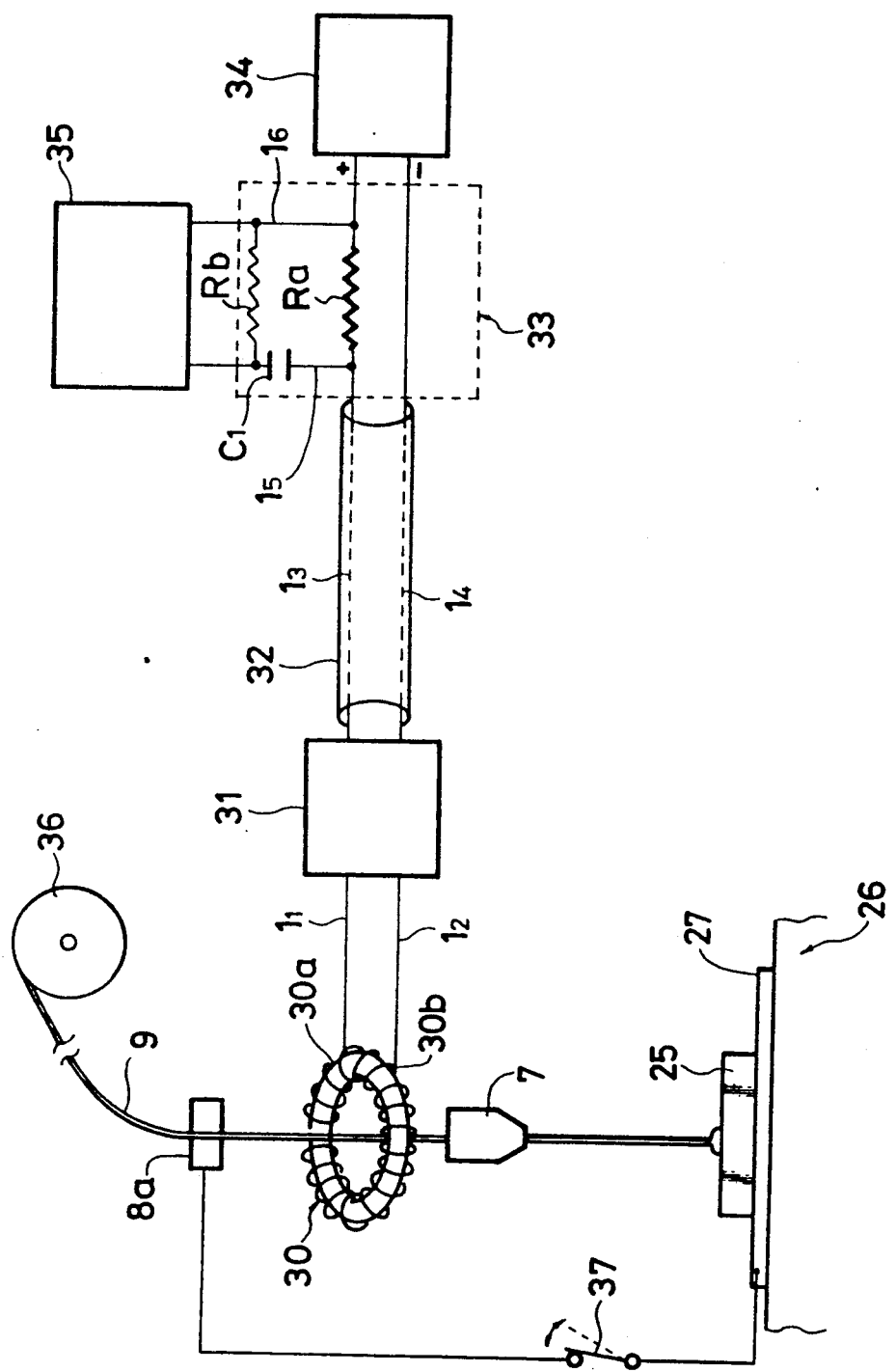
FIG. 4 is a conceptual drawing providing a general explanation of the detection principle of the bonding misattachment detection apparatus of a first embodiment of the present invention.

The following provides an explanation of a bonding misattachment detection apparatus as a first embodiment of the present invention. FIG. 4 is a conceptual drawing providing a general explanation of the detection principle of the bonding misattachment detection apparatus pertaining to the present invention.

As indicated in FIG. 4 and FIG. 2, toroidal coil 30 is mounted by a mounting device not shown between capillary 7 and clamp 8a attached on the end of bonding arm 1. Although this toroidal coil 30 is mounted on oscillating arm 2 in this embodiment, it may also be attached to a frame, etc., supported on an XY table, etc. In addition, this toroidal coil 30 is of a composition in which a coil is wrapped around a doughnut-shaped core, with both ends 30a and 30b of said coil connected to high frequency oscillator 31 via lines $1_1$ and $1_2$. In addition, lines $1_3$ and $1_4$, shielded by cable 32, are connected to this high frequency oscillator 31, and lines $1_3$ and $1_4$ are connected to a misattachment detection device in the form of differentiation circuit 33. This differentiation circuit 33 is connected to the positive input side of direct current power supply 34 by one of the lines $1_3$ via a resistor $R_a$, while the other line $1_4$ is connected to the negative input of said direct current power supply 34. In addition, both ends of resistor $R_a$ of differentiation circuit 33 are connected to condenser $C_1$, and resistor $R_b$ is connected between lines $1_5$ and $1_6$. In addition, monitoring device 35 is connected to line $1_6$. This monitoring device 35 is comprised of an oscilloscope, etc., and allows monitoring in the form of a monitor of the differential output of differentiation circuit 33.

In addition, wire 9 wrapped around spool 36 is pulled out through the center of the core of toroidal coil 30, and passed through tension clamp 11, guide 12 (shown in FIG. 2) and clamp 8a. This wire 9 is further passed through capillary 7. Furthermore, FIG. 4 indicates the ball formed on the end of the wire being bonded and crushed on a pad on IC chip 25 as capillary 7 rises upward.

In addition, one end of lead 27 placed on bonding stage 26 is connected to clamp 8a via switch 37.

Figure 5:
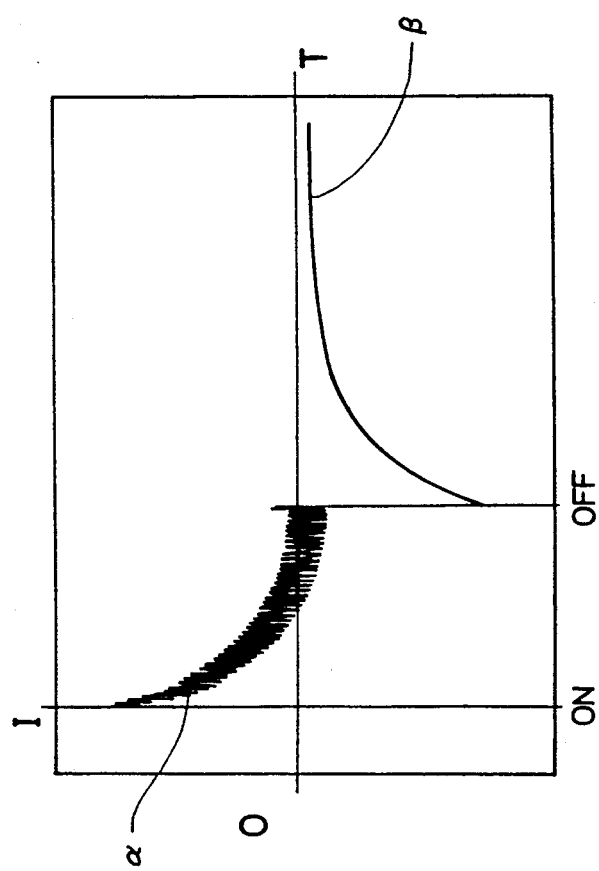
FIG. 5 is a diagram of a waveform measured by a monitoring device using the bonding misattachment detection apparatus indicated in FIG. 4.

The following provides an explanation of the action of the bonding misattachment detection apparatus having the above-mentioned composition. FIG. 5 is a diagram of a waveform measured by monitoring device 35 using the bonding misattachment detection apparatus indicated in FIG. 4. Current I is indicated in the vertical direction, and time T is indicated in the horizontal direction in this diagram. In addition, since the wire bonding process in the wire bonder on which the bonding misattachment detection apparatus of the present invention is equipped is the same as that indicated in FIG. 1, a detailed explanation of that process will be omitted here, with an explanation provided only for those locations that are necessary for the sake of explanation.

Firstly, the high frequency oscillated from high frequency oscillator 31 by a power voltage from direct current power supply 34, is generated via toroidal coil 30. Although this high frequency oscillator 31 is made to operate continuously during operation of the wire bonder in this embodiment, it may also be composed so as to operate at a prescribed timing during bonding. This high frequency passes through IC chip 25 via wire 9 passing through nearly the center of toroidal coil 30. Due to the presence of electrostatic capacity in IC chip 25, this high frequency passes through said IC chip 25. Switch 37 then closes as indicated in FIG. 4 after closing of clamp 8a. When this is immediately turned on, a loop is formed with clamp 8a, and first waveform α, consisting of superposition of the high frequency components, appears on monitoring device 35 as indicated in FIG. 5. When switch 37 is turned off, second waveform β appears as indicated in FIG. 5. Thus, changes in high frequency components can be converted into changes in DC current, which are then output in the form of a differential output. Moreover, bonding disattachment can also be detected in the case of bonding at low voltage and current levels.

Figure 6:
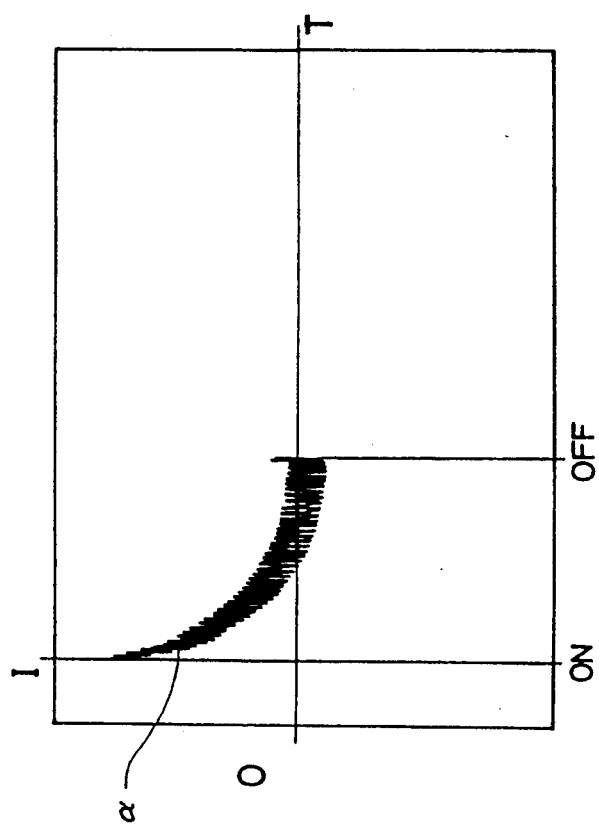
FIG. 6 is a diagram of a waveform at the time a ball formed on the end of a wire is properly bonded to the pad of an IC chip corresponding to a 1st bonding point.
Figure 7:
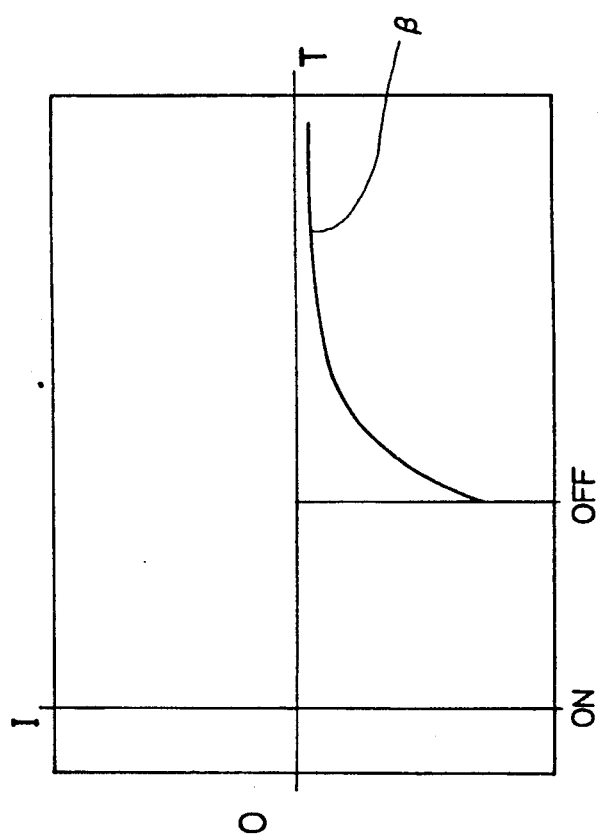
FIG. 7 is a diagram of a waveform at the time of misattachment resulting from the wire not being properly cut from the lead corresponding to a 2nd bonding point.

Next, FIGS. 6 and 7 indicate waveforms at the time of detection of bonding misattachment in the case of actual. wire bonding based on the operating principle of the above-mentioned bonding misattachment detection apparatus. The following provides an explanation of the actual detection method based on said waveforms. Furthermore, the manner by which those waveforms are expressed is the same as that of FIG. 5.

Figure 10:
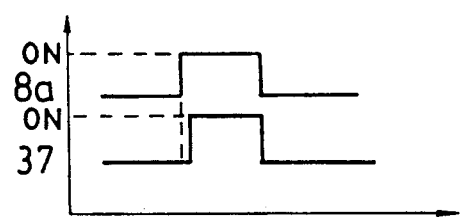
FIG. 10 is a timing chart indicating the timing between clamp 8a and switch 37.

FIG. 6 indicates a waveform at the time a ball formed on the end of a wire is properly bonded to a pad of IC chip 25 corresponding to a first bonding point. Thus, when the ball is not properly connected to this first bonding point, waveforms α and β do not appear even if clamp 8a and switch 37 are closed. Thus, since the pad of IC 25, corresponding to the first bonding point, and the ball are not properly bonded, this is detected as a misattachment. In this apparatus, detection of misattachment at the first bonding point is performed by first closing clamp 8a and then closing switch 37 according to the timing indicated in FIG. 10 during the rising step of loop (4) of the bonding process indicated in FIG. 1.

Figure 1:
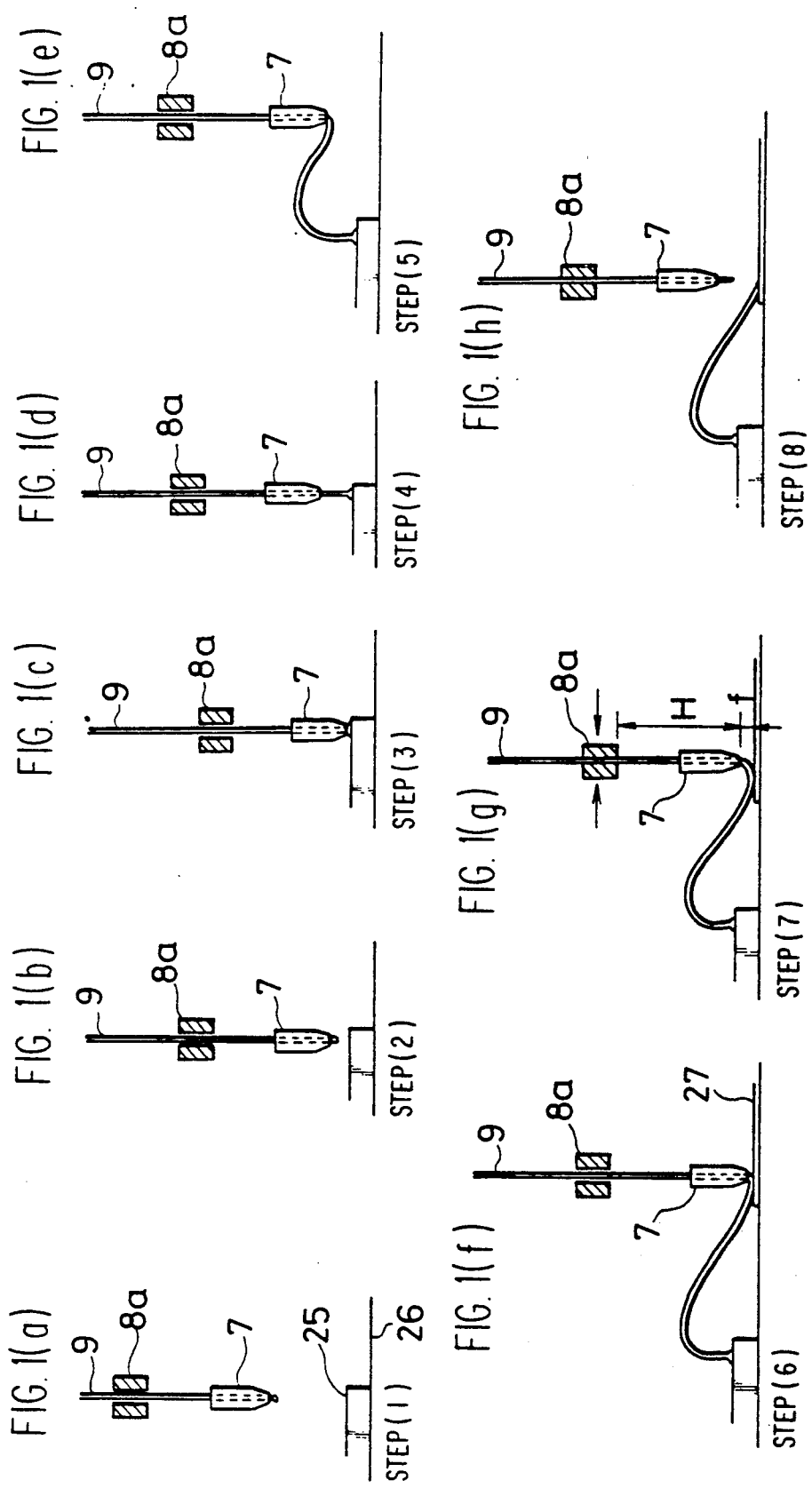
FIGS. 1(a)–1(h) are schematic drawings indicating the bonding steps of a wire bonder of the prior art.

Next, after wire 9 is properly bonded to lead 27, the second bonding point, wire 9 is cut from the second bonding point as indicated in FIG. 1 following the wire bonding process. Thus, second waveform β appears as indicated in FIG. 7. However, when this second waveform β is not measured by monitoring device 35, wire 9 is not properly cut from lead 27, corresponding to the second bonding point, and a misattachment is detected. As a result of monitoring this type of detection waveform, misattachments can be detected at both the first and second bonding points. Furthermore, the timing between the operation of clamp 8a and the switching (on/off) of switch 37 at the second bonding point is performed according to the timing indicated in FIG. 10.

Figure 8:
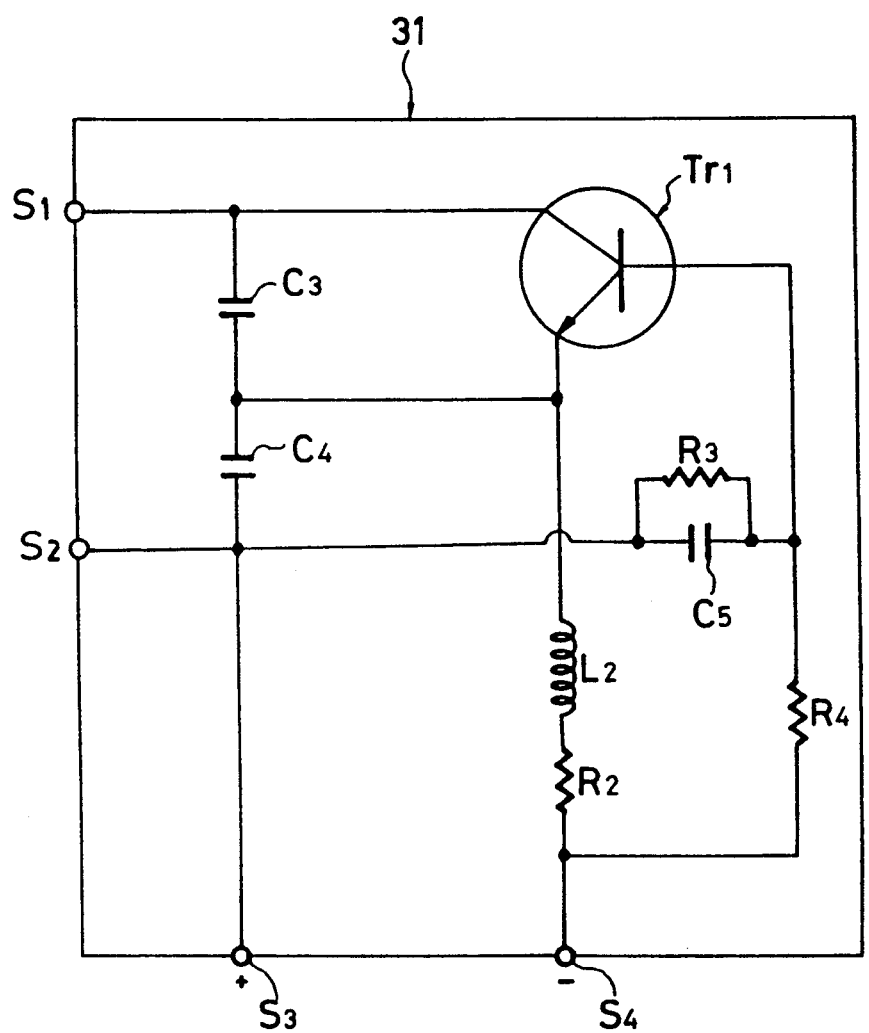
FIG. 8 is a circuit drawing indicating one example of a specific circuit of high frequency oscillator 31 indicated in FIG. 4.

Next, FIG. 8 is a circuit drawing indicating one example of a specific circuit of high frequency oscillator 31 indicated in FIG. 4.

As indicated in FIG. 8, terminal $S_1$ is connected to line $l_1$ indicated in FIG. 4, and terminal $S_2$ is connected to line $l_2$. Condensers $C_3$ and $C_4$ are arranged between these two terminals, and the emitter of transistor $Tr_1$ is connected between said condensers $C_3$ and $C_4$. Oscillation frequency f is determined by the above-mentioned condensers $C_3$ and $C_4$ as well as toroidal coil 30.

In addition, one end of the above-mentioned terminal $S_1$ is connected to the collector of transistor $Tr_1$, and the other end is connected to the base of transistor $Tr_1$ via condenser $C_5$ connected in parallel with resistor $R_3$. In addition, the base of the above-mentioned transistor $Tr_1$ is connected to terminal $S_4$ via resistor $R_4$. This resistor $R_4$ and the above-mentioned resistor $R_3$ are bias resistors of transistor $Tr_1$. In addition, the above-mentioned terminal $S_4$ is connected to line $l_4$ indicated in FIG. 4.

On the other hand, terminal $S_3$ is connected to line $l_3$ indicated in FIG. 4. Coil $L_2$, for high frequency inhibition, and resistor $R_2$, for stabilization of the emitter of transistor $Tr_1$, are provided between said terminal $S_3$ and the emitter of transistor $Tr_1$. High frequency oscillator 31 is thus comprised of these constituents.

Figure 9:
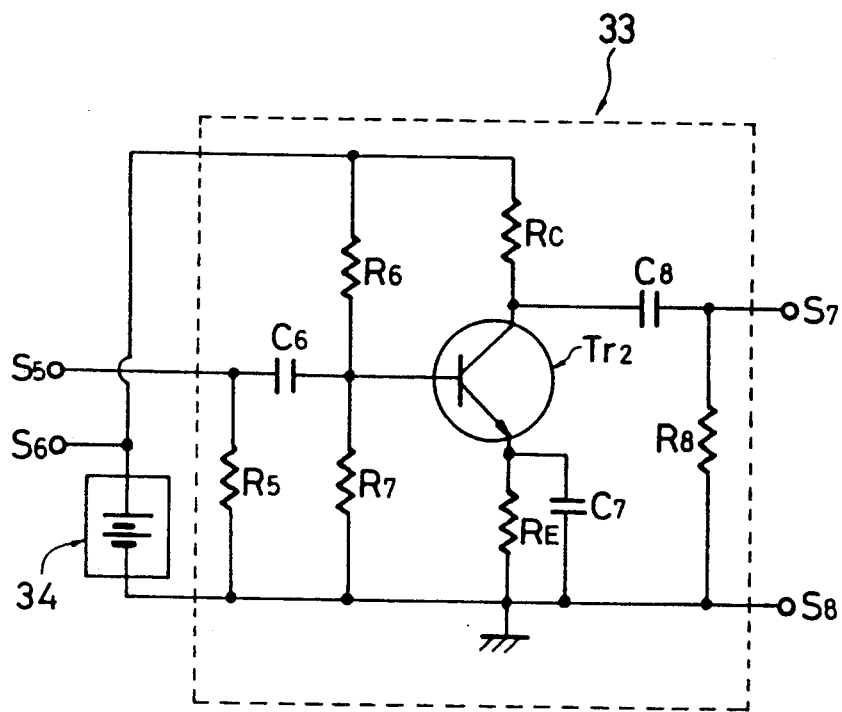
FIG. 9 is a circuit drawing indicating one example of a specific circuit of the differentiation circuit and direct current power supply indicated in FIG. 4.

FIG. 9 is a circuit drawing indicating one example of a specific circuit of the differentiation circuit and direct current power supply in the form of the misattachment detection apparatus indicated in FIG. 4.

As indicated in FIG. 9, terminal $S_5$ is connected to the base of transistor $Tr_2$ between split resistors $R_6$ and $R_7$ via condenser $C_6$. In addition, resistor $R_5$ is connected in parallel with the above-mentioned resistor $R_7$ between this terminal $S_5$ and the above-mentioned connector $C_6$.

On the other hand, terminal $S_6$ is connected to direct current power supply 34, while said direct current power supply is connected to the collector of the above-mentioned transistor $Tr_2$ via resistor $R_c$. Output terminal $S_7$ is connected between this resistor $R_c$ and the above-mentioned collector via condenser $C_8$. In addition, resistor $R_8$ is connected in parallel with said condenser $C_8$ between terminal $S_7$ and terminal $S_8$. In addition, resistor $R_E$ is grounded to the emitter of the above-mentioned transistor $Tr_2$ to ground said transistor, and condenser $C_7$ is connected in parallel with said resistor $R_E$.

Although the above-mentioned terminals $S_7$ and $S_8$ are connected to monitoring device 35 in the misattachment detection apparatus indicated in FIG. 4, this can also be composed to automatically perform various actions such as stopping the apparatus or sound an alarm when bonding misattachment has occurred during wire bonding by connecting said output to a control device not shown equipped with a memory circuit or arithmetic circuit, etc., comprising a microcomputer equipped on the wire bonder.

Figure 11:
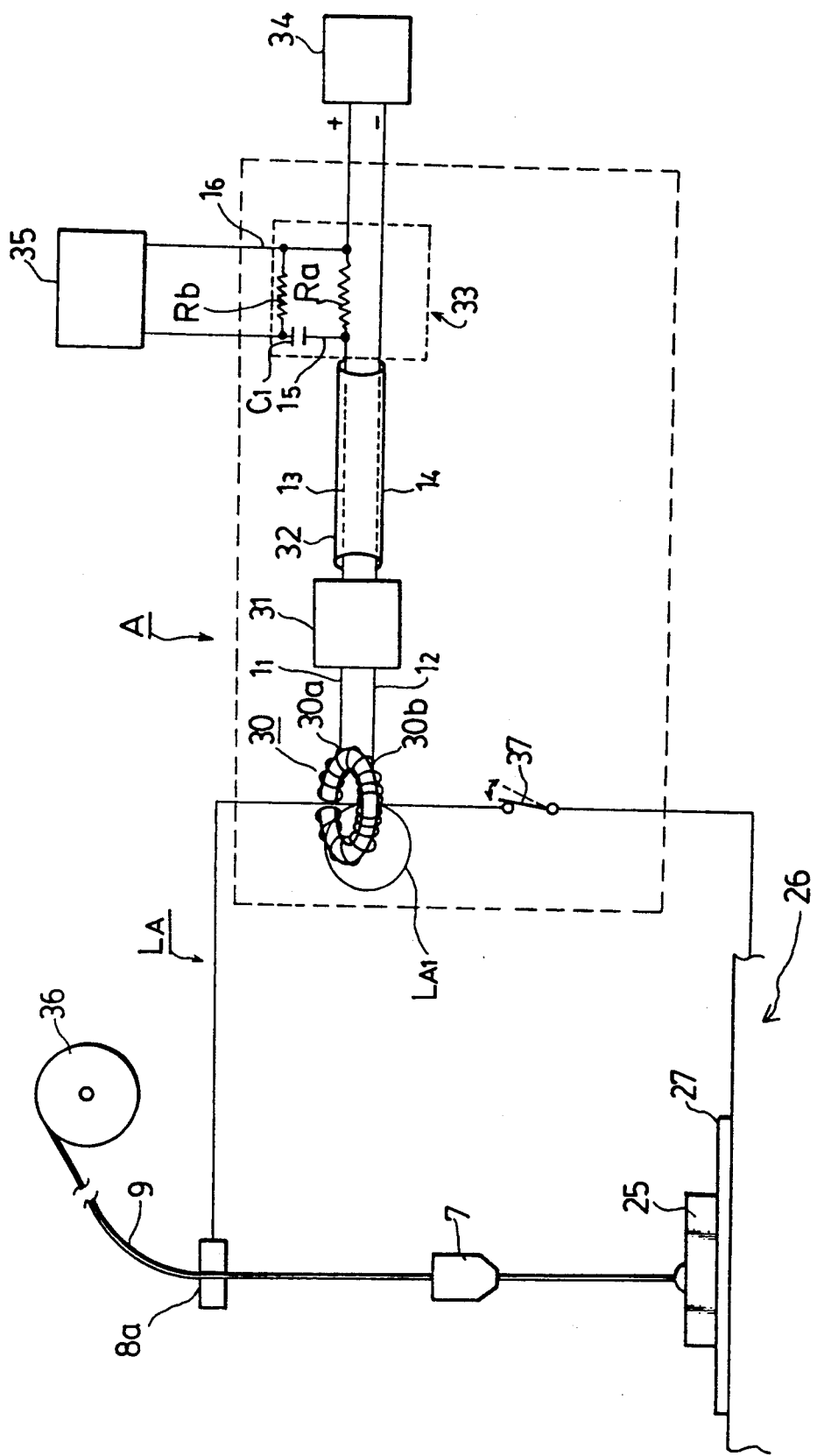
FIG. 11 is a conceptual drawing providing a general explanation of the detection principle of a bonding misattachment detection apparatus of a second embodiment of the present invention.

The following provides an explanation of a bonding misattachment detection apparatus as a second embodiment of the present invention. FIG. 11 is a conceptual drawing of the bonding misattachment detection apparatus of a second embodiment of the present invention. Furthermore, the following explanation is provided using the same reference numerals for those components and functions that are the same as those of the apparatus of the prior art, and focuses primarily on those points that differ.

The broken line A in FIG. 11 indicates that the bonding misattachment detection apparatus pertaining to the present invention can either be incorporated into a single unit with the bonder, or composed as a separate unit. This bonding misattachment detection unit is composed of a high frequency generation device and a misattachment detection device, and is placed on a moving table such as an XY table.

Toroidal coil 30 is held by a holding device not shown within unit A. This toroidal coil 30 is of a composition in which a coil is wrapped around a doughnut-shaped core, with both ends 30a and 31a of that coil connected to high frequency oscillator 31 via lines $l_1$ and $l_2$. This comprises a high frequency generation device.

In addition, lines $l_3$ and $l_4$, shielded by cable 32, are connected to this high frequency oscillator 31 to compose a high frequency generation device.

In addition, lines $l_3$ and $l_4$ are connected to a misattachment detection device in the form of differentiation circuit 33. This differentiation circuit 33 is connected to the positive input side of an externally installed (or built-in) direct current power supply 34 by line $l_3$ via a resistor $R_a$, the other line $l_4$ is connected to the negative input side of said direct current power supply 34. In addition, both ends of resistor $R_a$ of differentiation circuit 33 are connected to line $l_5$ connected to condenser $C_1$, and resistor $R_b$ is connected between lines $l_5$ and $l_6$. In addition, monitoring device 35 is connected to line $l_6$. This monitoring device 35 is comprised of an oscilloscope, etc., and allows monitoring in the form of a monitor of the differential output of differentiation circuit 33.

In addition, line $L_A$ passes through the center of the core of toroidal coil 30, and said line $L_A$ wraps at least once around the above-mentioned coil 30 (indicated with $L_{A1}$ in the drawing) without making contact. Consequently, since the voltage of line $L_A$ rises and the current decreases when the high frequency produced from toroidal coil 30 propagates to it, sensitivity becomes higher. One end of this line $L_A$ is connected to clamp 8a, and the other end is connected to bonding stage 26. As a result, a closed loop is formed by wire 9 and line $L_4$ as indicated in FIG. 11. Furthermore, since line $L_4$ is only required to form a loop with wire 9, it goes without saying that it does not have to be a single line connected to the above-mentioned clamp 8a and bonding stage 26.

On the other hand, wire 9 pulled out from spool 36 is passed through capillary 7 via tension clamp 11, guide 12 (shown in FIG. 2) and clamp 8a. Furthermore, FIG. 11 indicates the ball formed on the end of the wire being bonded and crushed on a pad on IC chip 25 as capillary 7 rises upward. One end of line $L_4$ connected to bonding stage 26 is connected via switch 37 as indicated in FIG. 11. In addition, bonding stage 26 is grounded.

Since the action of the bonding misattachment detection apparatus of the above-mentioned second embodiment is identical to that of the first embodiment, an explanation of that action is omitted.

As has been described above, the present invention offers the advantages indicated below.

(1) Since the present invention is able to detect whether wires to be connected to a bonded component are misattached by a misattachment detection device, the invention is constantly able to monitor the bonding state allowing improvement of bonding accuracy, thereby offering a first advantage of the present invention.

(2) Since the present invention is able to detect bonding misattachment without making contact with the wire by a high frequency generation device, the present invention offers a second advantage of allowing detection of bonding misattachment without risking damage to the bonded components.

(3) Since the present invention is able to convert the changes in high frequency components produced from a high frequency generation device into changes in DC current, and output those changes in the form of a differential output, the setting of the output level is easy, and bonding misattachment can be detected by a simple adjustment procedure even when different types of bonded components are bonded thereby resulting in improved work efficiency, a third advantage of the present invention.

(4) Since the present invention is able to detect bonding misattachment at low voltage and current levels using high frequency, bonding misattachment can be detected without requiring the considerable amount of time for setting current levels as was necessary in the past. Thus, the present invention can be suitably used in various apparatus allowing the composition of inexpensive apparatuses, thereby offering a fourth advantage of the present invention.

What is claimed is:

1. A bonding misattachment detection apparatus comprising: a bonding arm holding a bonding tool through which a wire is passed; a support mechanism that allows said bonding arm to be moved freely; a clamping device provided above the above-mentioned bonding tool that performs cutting of the wire by clamping the above-mentioned wire using an opening and closing mechanism; a high frequency generation device provided at a location above the above-mentioned bonding tool and not in contact with the above-mentioned wire; and, a misattachment detection device that detects whether a wire connected to a bonded component is misattached by generating a high frequency from said high frequency generation device; wherein, said misattachment detection device is able to detect whether the wire to be connected with the bonded component is misattached.

2. The bonding misattachment detection apparatus of claim 1 wherein the above-mentioned high frequency generation device is composed of a toroidal coil and a high frequency oscillator.

3. The bonding misattachment detection apparatus of claim 2 wherein the above-mentioned misattachment detection device is composed of a differentiation circuit.

4. The bonding misattachment detection apparatus of claim 1 wherein the above-mentioned misattachment detection device is composed of a differentiation circuit.

5. A bonding misattachment detection method comprising a wire bonding method by which a bonding arm holding a bonding tool, through which a wire is passed, is supported so as to be allowed to move freely by a support mechanism, and following completion of bonding of the above-mentioned bonding tool to a 1st bonding point by that movement, bonding is performed by moving said bonding tool to a 2nd bonding point; wherein, a misattachment detection device is able to detect whether a wire connected to a bonded component has been misattached by the generation of a high frequency by a high frequency generation device provided at a location above the above-mentioned bonding tool and not in contact with the above-mentioned wire.

6. The bonding misattachment detection method of claim 5 that is able to convert changes in high frequency components produced from the above-mentioned high frequency generation device into changes in DC current, and output those changes in the form of a differential output.

7. A bonding misattachment detection apparatus comprising:
a bonding stage on which a bonded component is placed; a bonding arm holding a bonding tool through which a wire is passed; a support mechanism that allows said bonding arm to be moved freely; a clamping device that performs cutting of the wire by clamping the above-mentioned wire using an opening and closing mechanism; a high frequency generation device provided within a path that forms a loop between said clamping device and the above-mentioned bonding stage while also remaining out of contact with the line that composes said path; and, a misattachment detection device that detects whether a wire connected to a bonded component is misattached by generating a high frequency from said high frequency generation device; wherein, said misattachment detection device is able to detect whether the wire to be connected with the bonded component is misattached.

8. The bonding misattachment detection apparatus of claim 7 wherein the above-mentioned line is wrapped at least once without making contact in the above-mentioned high frequency generation device.

9. The bonding disattachment detection apparatus of claim 8 wherein the above-mentioned disattachment detection device is composed of a differentiation circuit.

10. The bonding misattachment detection apparatus of claim 8 wherein the above-mentioned high frequency generation device is composed of a toroidal coil and a high frequency oscillator.

11. The bonding misattachment detection apparatus of claim 7 wherein the above-mentioned disattachment detection device is composed of a differentiation circuit.

12. The bonding misattachment detection apparatus of claim 7 wherein the above-mentioned high frequency generation device is composed of a toroidal coil and a high frequency oscillator.

13. The bonding disattachment detection apparatus of claim 9 wherein the above-mentioned disattachment detection device is composed of a differentiation circuit.

14. A bonding disattachment detection method comprising a wire bonding method by which a bonding arm holding a bonding tool, through which a wire is passed, is supported so as to be allowed to move freely by a support mechanism, and following completion of bonding of the above-mentioned bonding tool to a 1st bonding point by that movement, bonding is performed by moving said bonding tool to a 2nd bonding point; wherein, a misattachment detection device is able to detect whether a wire connected to a bonded component has been misattached by the generation of a high frequency by a high frequency generation device provided within a path that forms a loop between the above-mentioned bonding stage and a clamping device that performs cutting of wire by clamping the above-mentioned wire using a switch mechanism, while also remaining out of contact with the line that composes said path.

15. The bonding disattachment detection method of claim 14 that is able to convert changes in high frequency components produced from the above-mentioned high frequency generation device into changes in DC current, and output those changes in the form of a differential output.

* * * * *